(12) United States Patent
Kwolek et al.

(10) Patent No.: US 7,085,561 B1
(45) Date of Patent: Aug. 1, 2006

(54) EMBEDDED CHANNEL ANALYSIS FOR RF DATA MODEM

(75) Inventors: Richard Alan Kwolek, Fort Wayne, IN (US); Bruce Alden Wight, Fort Wayne, IN (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 141 days.

(21) Appl. No.: 10/836,196

(22) Filed: May 3, 2004

(51) Int. Cl.
*H04Q 7/20* (2006.01)

(52) U.S. Cl. .................................. 455/423; 455/452.2

(58) Field of Classification Search ............... 455/13.4, 455/69, 452.2, 504, 505, 506, 522
See application file for complete search history.

(56) References Cited

U.S. PATENT DOCUMENTS

| | | | |
|---|---|---|---|
| 4,985,900 A | 1/1991 | Rhind et al. | |
| 5,131,010 A * | 7/1992 | Derrenge et al. | 375/347 |
| 5,343,463 A * | 8/1994 | van Tetering et al. | 370/253 |
| 5,448,616 A | 9/1995 | Kaewell, Jr. et al. | |
| 5,450,305 A * | 9/1995 | Boys et al. | 363/24 |
| 5,751,767 A | 5/1998 | Tatsumi | |
| 5,764,626 A * | 6/1998 | VanDervort | 370/232 |
| 5,768,312 A | 6/1998 | Imamura | |
| 5,802,105 A | 9/1998 | Tiedemann, Jr. et al. | |
| 5,828,672 A | 10/1998 | Labonte et al. | |
| 5,835,597 A * | 11/1998 | Coppersmith et al. | 380/28 |
| 5,862,177 A | 1/1999 | Cummings et al. | |
| 5,870,211 A | 2/1999 | Yoshida | |
| 5,870,666 A | 2/1999 | Tanaka et al. | |
| 5,940,765 A * | 8/1999 | Haartsen | 455/462 |
| 5,991,622 A | 11/1999 | Henry, Jr. | |
| 6,137,830 A | 10/2000 | Schneider et al. | |
| 6,243,576 B1 | 6/2001 | Seike et al. | |
| 6,292,516 B1 | 9/2001 | Petsko et al. | |
| 6,539,205 B1 | 3/2003 | Wan et al. | |
| 6,715,112 B1 * | 3/2004 | Jungerman | 714/704 |
| 6,961,317 B1 * | 11/2005 | Abramovitch et al. | 370/252 |
| 2002/0023243 A1 | 2/2002 | Tomita | |
| 2002/0071152 A1 * | 6/2002 | Blumenthal | 359/123 |
| 2003/0063566 A1 | 4/2003 | Abramovitch et al. | |
| 2004/0209635 A1 * | 10/2004 | Hsu et al. | 455/522 |
| 2005/0084031 A1 * | 4/2005 | Rosen et al. | 375/295 |

FOREIGN PATENT DOCUMENTS

| | | |
|---|---|---|
| EP | 1067730 A | 1/2001 |
| EP | 1 126 640 A1 | 8/2001 |

* cited by examiner

*Primary Examiner*—Nick Corsaro
*Assistant Examiner*—Gary Au
(74) *Attorney, Agent, or Firm*—Edell, Shapiro & Finnan, LLC

(57) ABSTRACT

An embedded method for analyzing RF channel communication link parameters can include inserting data having a predetermined pattern to a transmission at a transmitter, processing the data through a waveform processor, transmitting the data across a communications link at traffic rates, receiving the transmitted data at a receiver, and determining a RF channel bit error rate of the transmitted data at the receiver. The transmitted data can include embedded synchronization and operating mode patterns such that the receiver can distinguish the transmitted data from contemporaneous voice or other data transmissions. A method for tracking received bits and counting received errors can include providing received bits to a decryption process, and providing test bits to an error analysis application to determine a total number of received errors.

14 Claims, 5 Drawing Sheets

| INDEX | PATTERN |
|-------|---------|
| 0 | 00111111 |
| 1 | 00001000 |
| 2 | 10100011 |
| 3 | 10111100 |
| 4 | 00111000 |
| 5 | 01101001 |
| 6 | 00110111 |
| 7 | x0101011 |
FIG.3
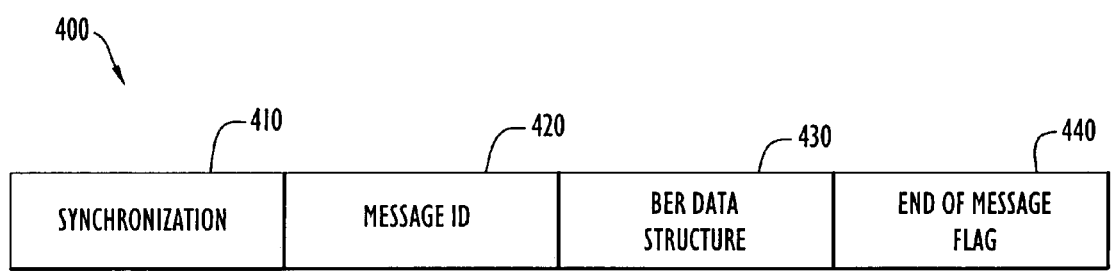
FIG.4
FIG.5

EMBEDDED CHANNEL ANALYSIS FOR RF DATA MODEM

FIELD OF INVENTION

This invention relates to a channel analyzing communication link parameters, and more particularly, to an embedded channel analysis application.

BACKGROUND

Bit error rate analyzers measure the rate of bit errors associated with the physical layer of communication links. This test equipment provides a defined sequence of bits, which are input at one end of a communication channel, and analyzed at the output of the other end of the communication channel. Counting the errors at the receiver provides the performance of the physical level of the communication channel. This method of testing may be applied to any channel media, including copper wire, fiber optics, and RF (radio frequency) transmissions.

Currently available bit error analyzers have shortcomings when trying to measure error rates associated with RF communication channels. An RF communication link needs an error analyzer at each end of the link as the range associated with RF communications are often significant distances. Designers of error analyzers are not typically knowledgeable of key RF parameters. As a result, analyzer test equipment often radiates noise in the RF spectrum, impacting the RF channel which is being measured. The resulting measurement, therefore, is not accurate, often providing a measurement of more errors than present on the RF channel without the analyzer being present. These shortcomings are, for example, incorrect range estimates, excess expense for relay capability, addition of interference, and decreased system performance. The ability to provide channel error analyzers with each radio to provide greater distance range, and to account for key RF parameters for more accurate error measurement is desirable. Lost power and size have been constraints.

SUMMARY

A channel analyzing communication link parameter, such as bit error rate, which is embedded within the communication equipment, rather than being in stand-alone test equipment, can improve and simplify traffic channel bit error rate analysis during verification and integration testing in response to a customer request. An application, which runs internal to the equipment that interfaces to the communications link under analysis, can provide channel analysis. No additional hardware, internal or external to the target equipment, needs to be included. Embedding of the RF channel link analyzer takes advantage of the knowledge of the normal equipment data flow.

Referring to FIG. 1, normally, user voice 110 or data 120 information is processed by a radio in the voice encoder 115 and data network 125, respectively, and formatted by a waveform protocol processor 130 into a data structure applicable for transmission. The resulting signal is prepared for transmission by the transmitting (Tx) RF Modem 140 after passing through Rx signal conditioning 135. The signal at the receiving antenna is converted from the RF signal to an electrical signal by the receiving (Rx) RF Modem 150, conditioned to a digital signal (at 155), processed through the voice decoder 175 and data network 185, respectively, reformatted (at 160) back into normal voice 170 or data 180 information, and presented to the user. The Tx and Rx signal conditioning 135, 155 control important characteristics of the radiated RF signal, such as channel bandwidth, percent of channel occupancy, carrier deviation, channel sensitivity, and adjacent channel rejection, which impact the RF channel performance.

Knowledge of the processing of the data allows insertion of a fixed data pattern at the transmitter, and detection of the data at the receiver. The fixed data pattern can be generated in the transmit waveform protocol processor, and analyzed for errors at the receiver's waveform protocol processor. Placing the test function in the waveform processor allows the signal to flow through the Tx and Rx RF signal conditioning so that the test transmission has the same RF signal characteristics as normal traffic. As a result, the analyzer function can provide the same signal environment as an actual transmission to provide identical error rate performance like in an actual transmission. Should the RF signal characteristics change, the resulting channel bit error rate would not be representative of the normal traffic channel.

Placing the test function in the waveform protocol processor allows the test pattern to be modified based on transmit waveform characteristics. Radios often have the capability for several different waveform structure options in single channel, frequency hopping, or other spread spectrum operating mode. It is important to ensure that the repetitive nature of the test data does not have negative characteristics when inserted into each waveform structure. While the specific test data is not critical, the test pattern should appear pseudo-random within the waveform structure. This is achieved by placing the function internal to the target equipment, and engineering the test pattern with knowledge of the waveform characteristics.

The waveform protocol can include embedded synchronization and operating mode patterns used by the receiver to detect and identify the RF traffic type. This allows the receiver to determine whether the transmission is voice, data, or the error test pattern. The synchronization pattern also allows the location of the first transmitted test bit within the waveform. Being able to locate the first test bit and using a predefined repeating pattern, the receiver is able to verify each individual test bit to determine whether it is an error or not. The transmitted test data sends a repetitive pattern of test data following the sync and mode information that continues until 100,000 test bits are sent. Counting the number of errors in 100,000 bits allows the bit error rate to be very precisely described.

In one general aspect, an embedded method for analyzing RF channel communication link parameters can include inserting data having a predetermined pattern to a transmission at a transmitter, processing the data through a waveform processor, transmitting the data across a communications link at traffic rates, receiving the transmitted data at a receiver; and determining a RF channel bit error rate of the transmitted data at the receiver. The transmitted data can includes embedded synchronization and operating mode patterns such that the receiver can distinguish the transmitted data from contemporaneous voice or other data transmissions.

Some or all of the following features may be included in the above-described system. The predetermined pattern can be a psuedo-random bit pattern. The predetermined pattern can be aperiodic to the transmit waveform structures. The predetermined pattern can be in a table and the table can be indexed. The table can include bits and the bits can start with Index 0 LSB. The predetermined pattern can be determined by characteristics of the transmit waveform characteristics.

The waveform structure can include at least one of synchronization, message ID, BER data structure, and an end of message flag.

In another general aspect, a device for embedded channel for analyzing RF communication link parameters can include an interface for inserting data having a predetermined pattern to a transmission at a transmitter, a waveform processor of the transmitter for processing the data, a transmitter for transmitting the processed data at traffic rates across a communications link, a receiver for receiving the transmitted data, and a processor for determining a RF channel bit error rate of the transmitted data. The transmitted data can include embedded synchronization and operating mode patterns such that the receiver can distinguish the transmitted data from contemporaneous voice or other data transmissions.

Some or all of the following features may be included in the above device. The predetermined pattern can be a psuedo-random bit pattern. The predetermined pattern can be aperiodic to the transmit waveform structures. The predetermined pattern can be in a table and the table can be indexed. The table can include bits and the bits can start with Index 0 LSB. The predetermined pattern can be determined by characteristics of the transmit waveform characteristics.

The waveform structure can include at least one of synchronization, message ID, BER data structure, and an end of message flag.

In another general aspect, a process for tracking received bits and counting received errors can include providing received bits to a decryption process, and providing test bits to an error analysis application to determine a total number of received errors.

The process can also include detecting an initiation message, initializing a plurality of receive counters, extracting data from receiver buffer, determining a number of errors in a predetermined set of data, calculating a running number of errors in a message, if frequency hopping on an individual hop basis, transmitting the running number of errors along with frequency information to identify frequency dependent sources of interference, determining, if frequency hopping, and, if frequency hopping, directing output of hop information if at the end of a hop, outputting hop information, resetting hop counters, detecting an end of message, and directing output of message data.

In another general aspect, a method for tracking received bits and counting received errors can include providing received bits to a decryption process and providing test bits to an error analysis application to determine a total number of received errors.

The method may also include detecting a BER message, initialize a plurality of receive counters, extracting BER data from receiver buffer, determining a number of errors in a predetermined set of data, calculating a running number of errors in a message, if frequency hopping on an individual hop basis, transmitting the running number of errors along with frequency information to identify frequency dependent sources of interference, determining if frequency hopping and, if frequency hopping, directing output of hop information, if at the end of a hop, outputting hop information, resetting hop counters, detecting end of message, and directing output of message data.

Using technological advancements, an analysis tool can be embedded in the radio itself. The design of a unique RF waveform protocol, which is structured specifically for the measurement of channel errors, allows the equipment to provide channel analysis while the equipment is simultaneously able to support the normal voice communication functionality.

BRIEF DESCRIPTION OF FIGURES

FIG. 3 is a chart presenting examples of test patterns in a pre-loaded look-up table;

FIG. 4 is an example of a waveform structure;

FIG. 5 is an exemplary representation of the RF waveform including characteristic short transmissions followed by a pause in the RF;

DETAILED DESCRIPTION

Knowledge of the channel bit error performance is valuable information when deploying and managing radio networks. Channel bit error performance can vary between each radio in the network. Understanding network performance requires an assessment of the channel error rate for each communication link. Currently, channel error analyzers cannot be included in each deployed radio.

A deployed radio, however, can include bit error analysis functions such that an RF communication link can be analyzed without additional unique test equipment. According to the invention, each radio can support both the source transmit and destination receive analysis function, so that link analysis can be performed in either direction. Such a radio can be designed so that internal noise does not affect the RF communication channel.

Normally, user voice or data information is processed by the radio, and formatted by the waveform protocol processor into a data structure applicable for transmission. The resulting signal is conditioned in preparation for transmission by the Tx RF Modem. The signal at the receiving antenna is converted from the RF signal to an electrical signal by the Rx RF Modem, conditioned to a digital signal, reformatted back into normal voice or data information, and presented to the user. The Tx and Rx signal conditioning controls important characteristics of the radiated RF signal which impact the RF channel performance. These characteristics include parameters such as channel bandwidth, percent of channel occupancy, carrier deviation, channel sensitivity, and adjacent channel rejection.

Knowledge of the processing of the data allows insertion of a fixed data pattern at the transmitter, and detection of the data at the receiver. The fixed data pattern is generated in the transmit waveform protocol processor, and analyzed for errors at the Rx waveform protocol processor.

Figure 1:
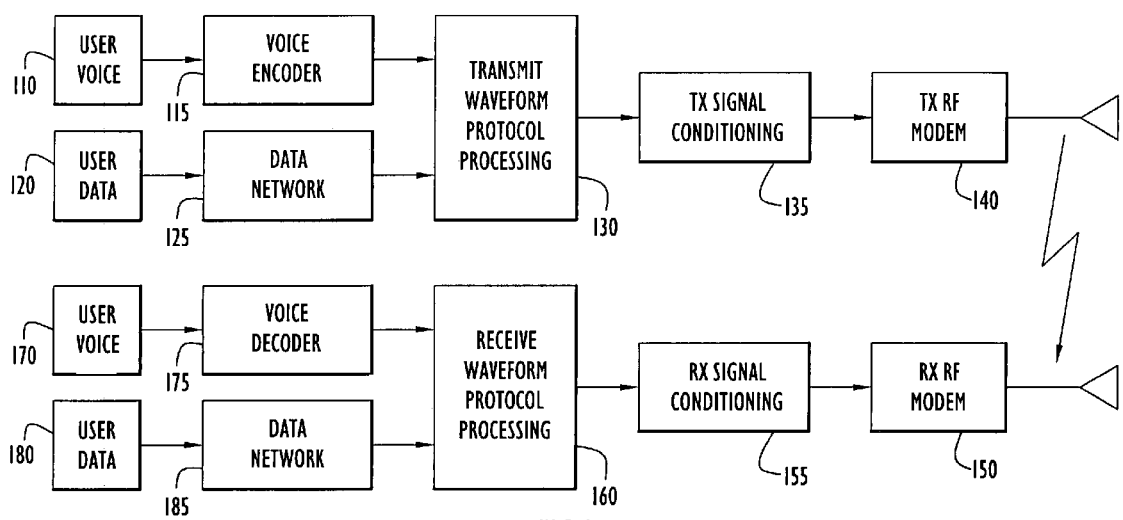
FIG. 1 is a simplistic illustration of the data flow through a typical radio communication link.
Figure 2:
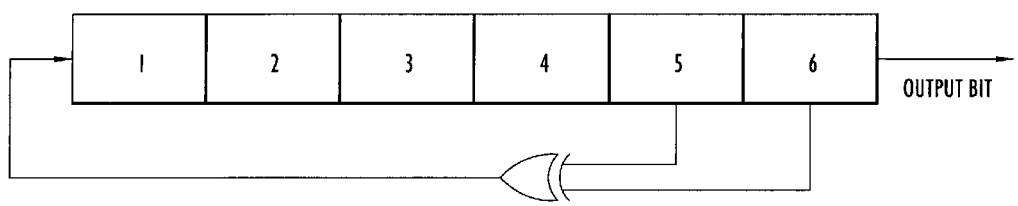
FIG. 2 is an example of a test pattern generator for the present invention.

Referring to FIG. 2, the test data pattern 200 length is determined by characteristics of the waveform structures to ensure that the pseudo random bit pattern used for BER checking is a-periodic to the transmit waveform structures. This is particularly important in spread spectrum systems.

Referring to FIG. 3, depending on the implementation, it is possible to use a table look up process, where the table 300 is preloaded with possible patterns and the software indexes through the table as many times as required for the duration of the transmission or reception. The bits in the table are laid into the serial TX waveform starting with Index 0 LSB. Note there is no sequence of 8 consecutive zeros. In the actual implementation, the table can be extended such that the bytes are fully enumerated for ease of processing at run time.

Placing the test function in the waveform processor allows the signal to flow through the Tx and Rx RF signal conditioning such that test transmission has the same RF signal characteristics as normal traffic. As a result, the analyzer function can provide the same signal environment as an actual transmission so as to provide an error rate performance like an actual transmission. Should any of these RF signal characteristics change, the resulting channel bit error rate would not be representative of the normal traffic channel.

Placing the test function in the waveform protocol processor also allows the test pattern to be modified based on transmit waveform characteristics. Referring to FIG. 4, a notional waveform structure 400 can include, for example, the following fields: synchronization 140, message ID 420, BER data structure 430, and an end of message flag 440. The synchronization field 410 is used by the receiving radio to detect a transmitted message and includes embedded patterns to allow the receiver to unambiguously locate the start of the Message ID field 420. The use of the Message ID 420 allows the test system to support both the BER test waveform 430, but also other voice or data waveforms to be used to coordinate the test set up and results. This allows the BER test data to be used without interfering with normal traffic. Since the Message ID 420 is of a known pattern, the receiving radio knows where the first bit of the BER test pattern is located. The BER pattern is predetermined, so every transmitted bit is known. The receiver can validate each received bit and accumulate the total number of errors during any BER test transmission.

Radios often have the capability for several different waveform structure options in single channel, frequency hopping, or other spread spectrum operating modes. It is important to insure that the repetitive nature of the test data does not have negative characteristics when inserted into each waveform structure. While the specific test data is not critical, the test pattern should appear pseudo-random within the waveform structure. This is possible only by placing the function internal to the target equipment, and engineering the test pattern with knowledge of the waveform characteristics.

Referring to FIG. 5, as mentioned above about test pattern generation, there may be periodic aspects of the waveform, where it is desirable to ensure the test pattern is in fact a-periodic. A particular type of spread spectrum technology, for example, uses the concept of frequency hopping. In this technique, the transmitter and receiver rapidly select and change the operating RF frequency. In this case, the RF waveform 500 has the characteristic of short transmissions followed by a pause in RF, as shown in FIG. 5.

For example, the gaps indicate periods of no RF entry. Due to characteristics of RF detectors and A/D converters, when testing for BER, the test data should appear random within the hops. Particular attention needs to be paid to the randomness at the beginning and the end of the data in each hop to prevent biasing of the resulting demodulation either for or against an error. An incorrect selection of the BER data set will not provide desired randomness.

The BER TX Software process can provide the test data bits in place of the data normally provided by the user for transmission. The remainder of the TX process uses the existing TX state machines for transmission. These are not shown, but would be known or standard processes.

Figure 6:
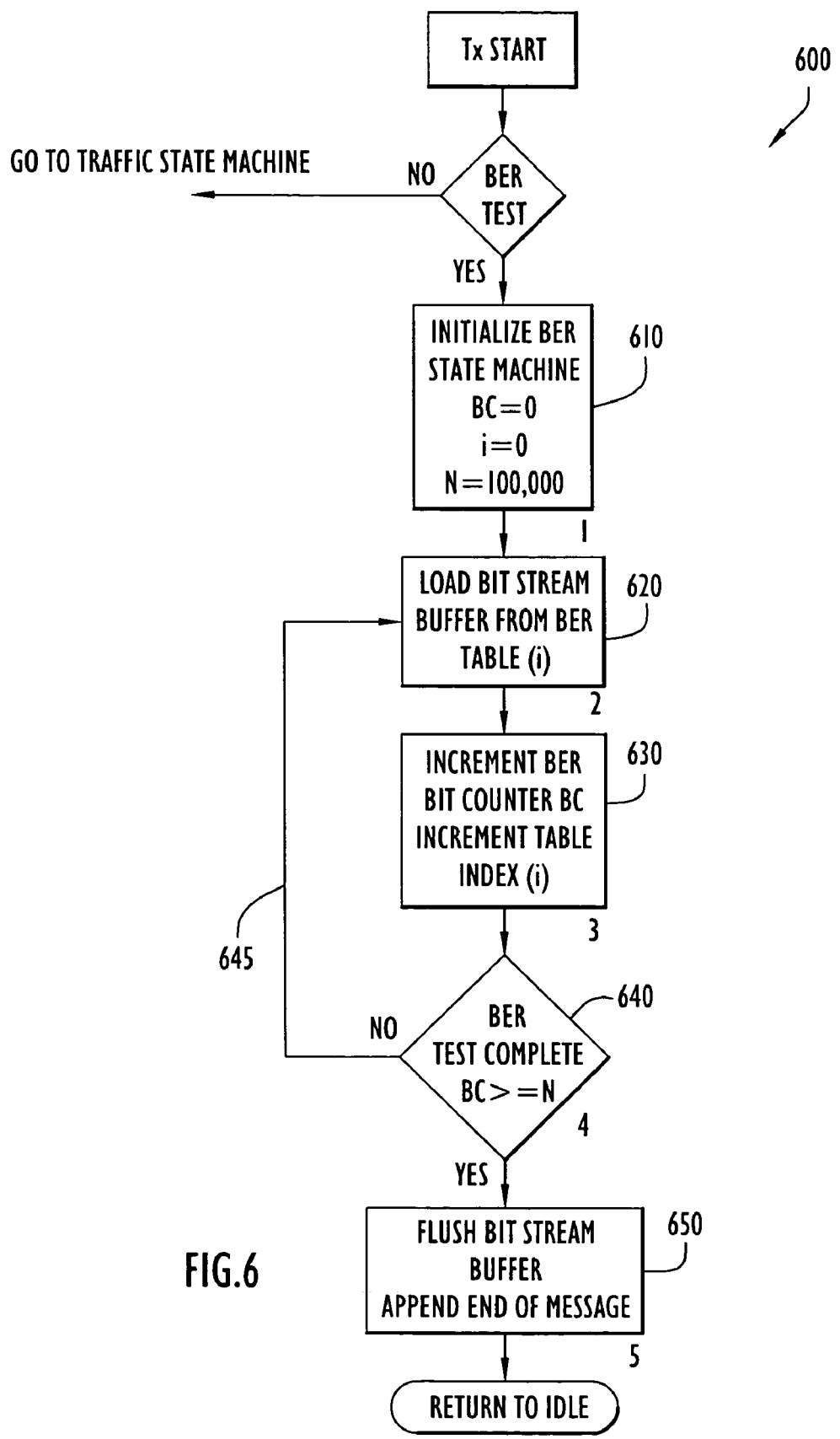
FIG. 6 is a flow chart explaining the BER transmit software process.

Referring to FIG. 6, a flowchart 600 describes the transmission side process following the start of transmission and beginning the BER test. First, counters and indices are initialized (Step 610). Then, the BIT stream Buffer from the BER table can be loaded for further processing by the TX state machines (Step 620). Next, the number of bits loaded into the Buffer can be counted and the position in the table can be incremented (Step 630). Then, whether the minimum number of bits has been loaded into the buffer can be checked (Step 640). If not, then the process loops (Step 645). Next, the transmission can be completed and the system can wait for another transmission (Step 650).

The BER Receive Software process is responsible for tracking the received bits and counting received errors. Similar to the TX process, the BER receive process can use standard receive data processes (not shown). The BER process is similar to the TX process up to the output of the data. During the BER process, instead of providing the received bits to the Decryption process, the test bits are provided to the BER application to accumulate the total number of received errors.

Figure 7:
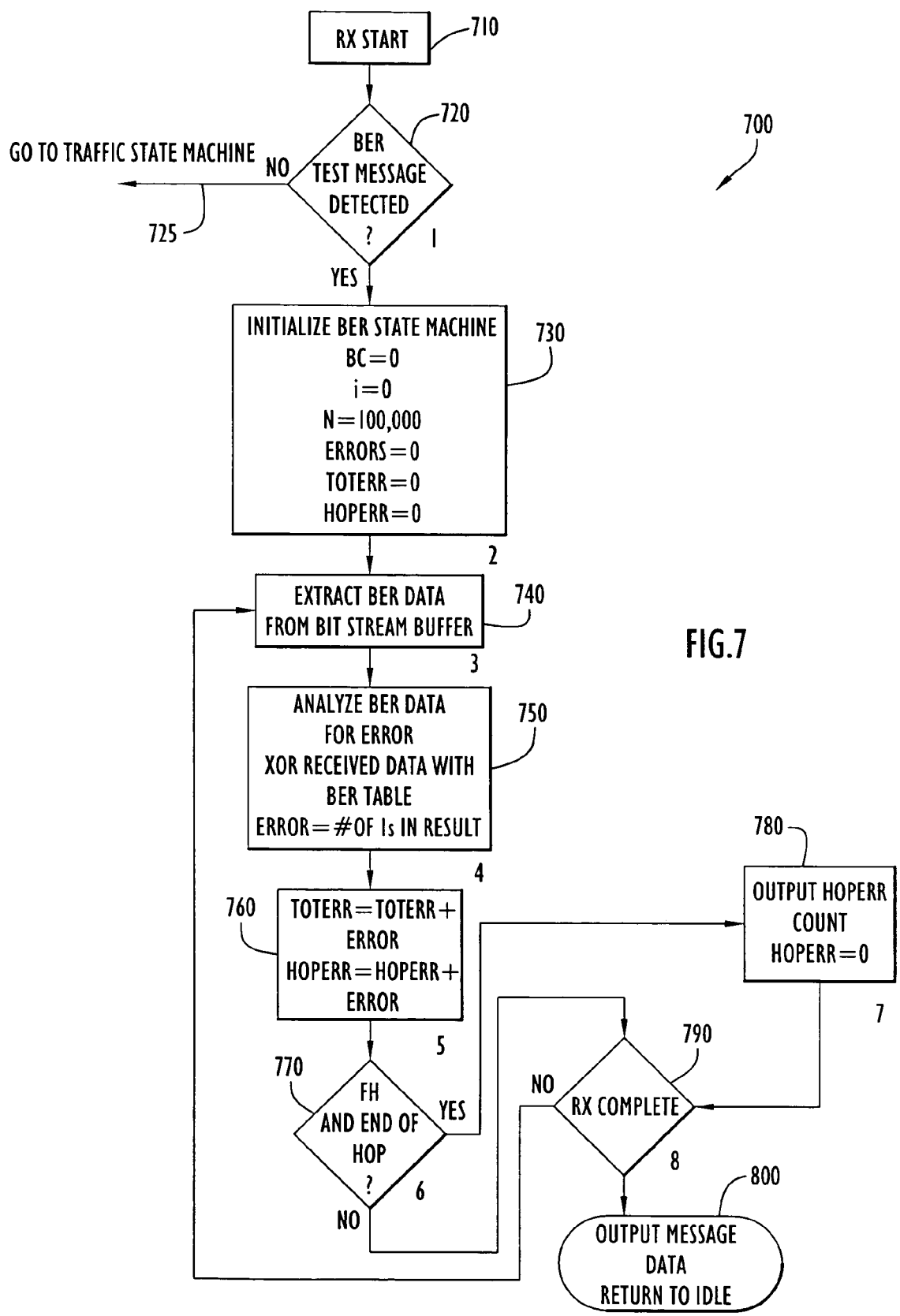
FIG. 7 is a flow chart explaining the BER receive software process.

Referring to FIG. 7, a flowchart 700 reflects the receive process. First, reception can be started (Step 710). If a test message is detected then a test is started (Step 720). If not, the reception is treated as typical data traffic (Step 725). Next, State 1 Receiver can detect a BER message (Step 730). Note, this allows for reception of voice and BER messages to allow for link engineering. Then, State 2 can initialize the receive counters (Step 730). State 3 can extract BER data from receiver buffer, making sure there is byte alignment to table values (Step 740). This is possible since the receiver has a prior knowledge of where the transmitter placed the test data. Then, State 4 determines the number of errors in a given set of data (Step 750). Next, State 5 can calculate the running number of errors in the entire message and if frequency hopping (FH) on an individual hop basis for output along with frequency to identify possible frequency dependent sources of interference (Step 760). State 6 can determine if the radio is frequency hopping and can direct output hop information if radio is at the end of a hop (Step 770). Then, State 7 can output hop information and reset hop counters (Step 780). The reception is completed (step 790), and state 8 detects end of message and directs output of message data and return to idle (Step 800).

The waveform protocol can include embedded synchronization and operating mode patterns used by the receiver to detect and identify the RF traffic type. This allows the receiver to determine whether the transmission is voice, data, or the error test pattern. The synchronization pattern also allows the explicit location of the first transmitted test bit within the waveform. Being able to locate the first test bit explicitly, and using a predefined repeating pattern, the receiver is able to verify each individual test bit to determine whether it is an error or not. The transmitted test data sends a repetitive pattern of test data following the sync and mode information that continues until 100,000 test bits are sent. Counting the number of errors in 100,000 bits allows the bit error rate to be very precisely described.

Figure 8:
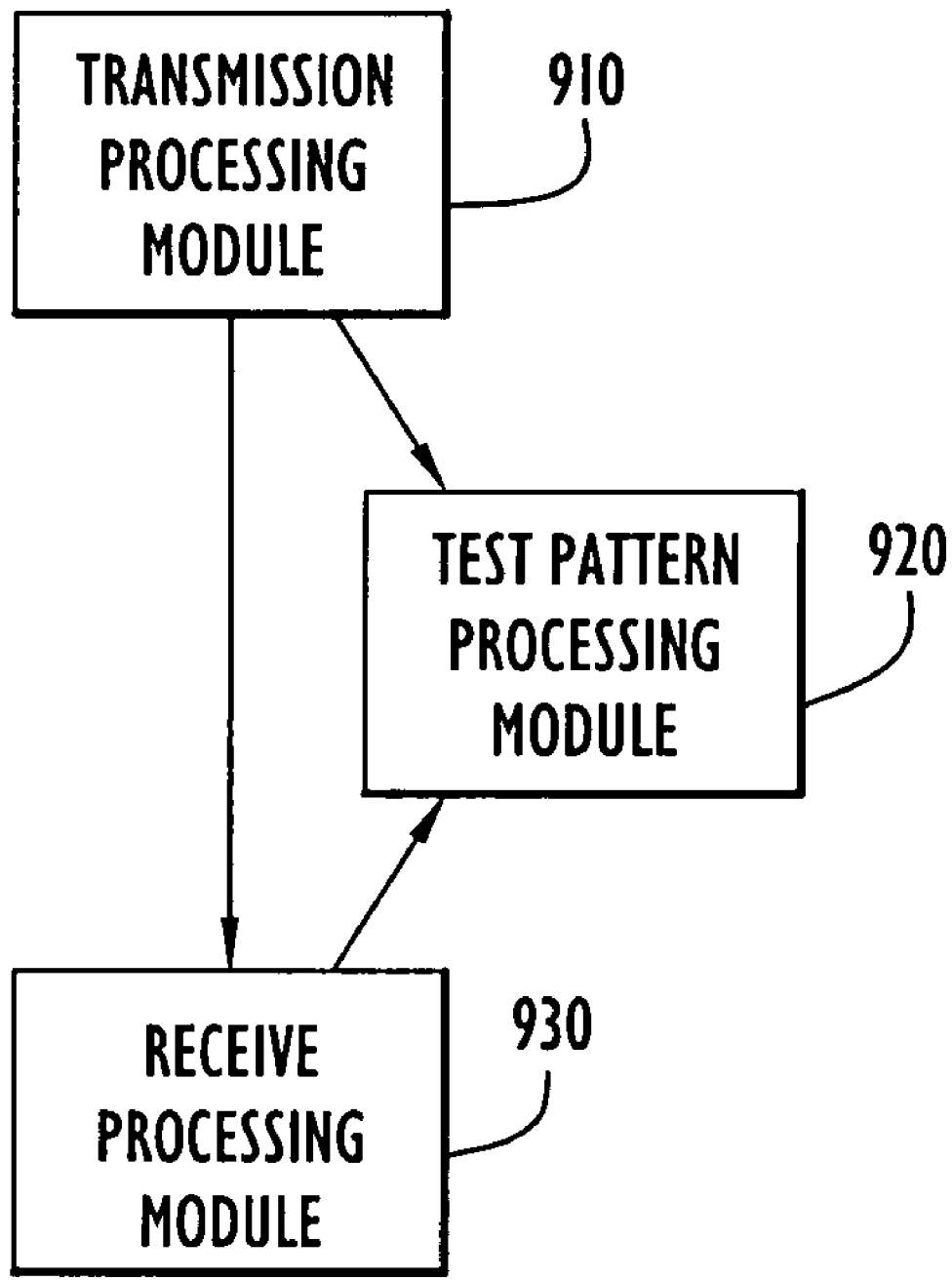
FIG. 8 is a block diagram of an exemplary device including embedded channel analysis.

Referring to FIG. 8, a block diagram of an exemplary device including embedded channel analysis has a transmission processing module 910, a test pattern processing module 920, and a receive processing module 930. The transmission processing module 910 can execute the transmission side process.

Following the start of transmission, the test pattern processing module 920 can begin the BER test. For example, counters and indices can be initialized; the bit stream buffer from the BER table can be loaded for processing by the TX state machines; the number of bits loaded into the buffer can be counted; the position in the table can be incremented; and whether the minimum number of bits has been loaded into the buffer can be checked. If not, then the process can loop. The transmission can be completed and the system can wait for another transmission.

The receive processing module 930 can execute the receive side processing, for example, using standard receive data processes. In the receive process module 930, reception can be started. If a test message is detected, then a test is started. If not, the reception is treated as typical data traffic by the receive process module 930.

If a test message is detected, the test pattern processing module 920 can detect a BER message; can initialize the receive counters; can extract BER data from receiver buffer, making sure there is byte alignment to table values; can determine the number of errors in a given set of data; can calculate the running number of errors in the entire message and if frequency hopping (FH) on an individual hop basis for output along with frequency to identify possible frequency dependent sources of interference; can determine if the radio is frequency hopping and can direct output hop information if radio is at the end of a hop; can output hop information and reset hop counters. The reception can be completed, an end of message can be detected, an output of message data can be directed, and the module can return to idle.

Such processing can be implemented in a device, as described above. However, the processing may also be implemented as software, hardware, a combination of the two, or using other known methods of implementation.

This invention may be applied to any equipment requiring link error analysis on a periodic basis to insure proper operation of the system, when distribution of unique test equipment is not practical.

A number of implementations have been described. Nevertheless, it will be understood that various modifications may be made without departing from the spirit and scope. Accordingly, other embodiments are within the scope of the following claims.

What is claimed is:

1. A process for counting received errors in a received message, comprising:
   providing received bits from the received message to a decryption process;
   determining a total number of errors in the received message comprising:
   initializing a plurality of receive counters;
   extracting data from a receiver buffer that stores the received message;
   determining a number of errors in a predetermined set of data in said received message;
   calculating a running number of errors in said received a message; and
   if the received message was transmitted using frequency hopping on an individual hop basis, outputting the running number of errors along with frequency hop information to identify frequency dependent sources of interference.

2. The process of claim 1, and further comprising generating a message that is transmitted to a device that receives the message which corresponds to said receive message in which errors are counted, wherein generating comprises generating a plurality of fields including a synchronization field, a message ID field that indicates whether the message contains information or bit error rate data, and an error rate data structure field comprising data having a predetermined bit pattern.

3. The process of claim 2, wherein the predetermined bit pattern is a psuedo-random bit pattern.

4. The process of claim 2, wherein the predetermined bit pattern is aperiodic with respect to transmit waveform structures of the message.

5. The process of claim 2, wherein generating comprises generating the predetermined pattern for the bit error rate data from a table of bits.

6. The process of claim 5, wherein the bits in the table start with Index 0 LSB.

7. The process of claim 2, wherein generating comprises generating the predetermined pattern for the bit error rate data based upon transmit waveform characteristics used by the transmitter for transmitting the message over the communications link.

8. A process for counting received errors in a received message, comprising:
   providing received bits from the received message to a decryption process;
   determining a total number of errors in the received message comprising:
   determining that there is BER data in the received message;
   initializing a plurality of receive counters;
   extracting the BER data from a receiver buffer;
   determining a number of errors in a predetermined set of data in said received message;
   calculating a running number of errors in said received message; and
   if the received message was transmitted using frequency hopping on an individual hop basis, outputting the running number of errors along with frequency hop information to identify frequency dependent sources of interference.

9. The process of claim 8, and further comprising generating a message that is transmitted to a device that receives the message which corresponds to said receive message in which errors are counted, wherein generating comprises generating a plurality of fields including a synchronization field, a message ID field that indicates whether the message contains information or BER data, and a BER data structure field comprising BER data having a predetermined bit pattern.

10. The process of claim 9, wherein the predetermined bit pattern is a psuedo-random bit pattern.

11. The process of claim 9, wherein the predetermined bit pattern is aperiodic with respect to transmit waveform structures of the message.

12. The process of claim 9, wherein generating comprises generating the predetermined pattern for the bit error rate data based upon transmit waveform characteristics used by the transmitter for transmitting the message over the communications link.

13. A method for analyzing RF channel communication link parameters, comprising:
   receiving at a communication device a message transmitted across the communication link;
   determining whether the message carries information or bit error rate data having a predetermined bit pattern; and
   when it is determined that the message contains bit error data, processing the bit error data to determine an RF channel bit error rate, wherein processing comprises determining a total number of errors in the received message by initializing a plurality of receive counters; extracting data from a receiver buffer that stores the received message; determining a number of errors in a predetermined set of data in said received message; calculating a running number of errors in said received a message; and if the received message was transmitted using frequency hopping on an individual hop basis, outputting the running number of errors along with frequency hop information to identify frequency dependent sources of interference.

14. The method of claim 13, wherein determining comprises examining a message ID field of the message, wherein the message ID field indicates whether the message carries information or bit error rate data, and further comprising extracting the bit error rate data from a bit error rate field of the message.

* * * * *